United States Patent
Xin (10) Patent No.: US 10,431,609 B2
(45) Date of Patent: Oct. 1, 2019

(54) ARRAY SUBSTRATE, DISPLAY PANEL WITH FRIT AT CUTTING EDGE FOR NARROW BEZEL

(71) Applicant: Shanghai Tianma AM-OLED Co., Ltd., Shanghai (CN)

(72) Inventor: Yu Xin, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/890,054

(22) Filed: Feb. 6, 2018

(65) Prior Publication Data

US 2019/0081091 A1    Mar. 14, 2019

(30) Foreign Application Priority Data

Sep. 13, 2017   (CN) .......................... 2017 1 0822202

(51) Int. Cl.
| | | |
|---|---|---|
| H01L 27/12 | (2006.01) | |
| H01L 23/31 | (2006.01) | |
| G02F 1/1362 | (2006.01) | |
| H01L 27/32 | (2006.01) | |
| H01L 51/52 | (2006.01) | |
| H01L 51/56 | (2006.01) | |

(52) U.S. Cl.
CPC .... H01L 27/1262 (2013.01); G02F 1/136227 (2013.01); H01L 23/3121 (2013.01); H01L 27/124 (2013.01); H01L 27/3244 (2013.01); H01L 27/3258 (2013.01); H01L 51/5246 (2013.01); H01L 51/56 (2013.01); *H01L 27/1214* (2013.01)

(58) Field of Classification Search
None
See application file for complete search history.

(56) References Cited

U.S. PATENT DOCUMENTS

| | | | |
|---|---|---|---|
| 8,188,509 B2* | 5/2012 | Lee | H01L 51/5246 257/100 |
| 8,258,696 B2* | 9/2012 | Oh | H01L 51/5246 |
| 2007/0170839 A1* | 7/2007 | Choi | C03C 8/24 313/500 |
| 2007/0170861 A1* | 7/2007 | Lee | C03C 8/24 313/512 |

(Continued)

FOREIGN PATENT DOCUMENTS

| | | |
|---|---|---|
| CN | 103219474 B | 3/2016 |
| CN | 205789980 U | 12/2016 |

(Continued)

*Primary Examiner* — Lex H Malsawma
(74) *Attorney, Agent, or Firm* — Anova Law Group, PLLC (57) ABSTRACT

An array substrate, a display panel, an encapsulation method for the display panel, and a display apparatus are provided. The array substrate comprises a display region and an encapsulation region divided into a first region away from the display region and a second region adjacent to the display region. The encapsulation region includes a metal layer configured only in the second region, a frit solution layer configured in both the first region and the second region, and a cutting edge configured in the first region. The array substrate which has been aligned and bonded with an encapsulation cover is cut along the cutting edge.

13 Claims, 8 Drawing Sheets

(56) References Cited

U.S. PATENT DOCUMENTS

| | | | | |
|---|---|---|---|---|
| 2009/0280714 A1* | 11/2009 | Fukuda | ............... | H01J 9/02 |
| | | | | 445/25 |
| 2009/0295687 A1* | 12/2009 | Wang | ............... | H01J 11/10 |
| | | | | 345/60 |
| 2010/0013071 A1* | 1/2010 | Chol | ............... | H01L 51/5246 |
| | | | | 257/682 |
| 2010/0046191 A1* | 2/2010 | den Boer | ............ | H05K 9/0088 |
| | | | | 361/818 |
| 2011/0133640 A1* | 6/2011 | Lingle | ............ | H05K 9/0088 |
| | | | | 313/582 |
| 2014/0061596 A1* | 3/2014 | Wu | ............... | H01L 27/3258 |
| | | | | 257/40 |
| 2014/0332774 A1* | 11/2014 | Wu | ............... | H01L 51/5246 |
| | | | | 257/40 |
| 2015/0144907 A1* | 5/2015 | Lin | ............... | H01L 51/56 |
| | | | | 257/40 |
| 2015/0194625 A1* | 7/2015 | Kim | ............... | H01L 27/3223 |
| | | | | 257/40 |
| 2015/0311472 A1* | 10/2015 | Hong | ............... | H01L 51/5246 |
| | | | | 257/72 |

FOREIGN PATENT DOCUMENTS

| | | |
|---|---|---|
| CN | 205863170 U | 1/2017 |
| CN | 106684257 A | 5/2017 |

* cited by examiner

ARRAY SUBSTRATE, DISPLAY PANEL WITH FRIT AT CUTTING EDGE FOR NARROW BEZEL

CROSS-REFERENCES TO RELATED APPLICATIONS

This application claims the priority of Chinese Patent Application No. 201710822202.8, filed on Sep. 13, 2017, the entire contents of which are incorporated herein by reference.

FIELD OF THE DISCLOSURE

The present disclosure generally relates to the field of display technology and, more particularly, relates to an array substrate, a display panel, an encapsulation method for the display panel, and a display apparatus.

BACKGROUND

Currently, display panels have many various encapsulation methods, among which the frit solution encapsulation method has been widely used due to its simplicity.

In the existing display panel, when a metal layer and a frit solution layer are formed in an encapsulation region, and the edges are often not sufficiently flat. When the edges of the display panel are cut, the cutting result is often undesirable. As a result, a cutting region is often reserved in the peripheral of the encapsulation region. Thus, it is difficult to design a substantially narrow bezel in the existing display panel, and the display performance is affected.

The disclosed array substrate, display panel, encapsulation method for the display panel, and display apparatus are directed to solve one or more problems set forth above and other problems.

BRIEF SUMMARY OF THE DISCLOSURE

One aspect of the present disclosure provides an array substrate, comprising a display region and an encapsulation region divided into a first region away from the display region and a second region adjacent to the display region. The encapsulation region includes a metal layer configured only in the second region, a frit solution layer configured in both the first region and the second region, and a cutting edge configured in the first region. The array substrate which has been aligned and bonded with an encapsulation cover is cut along the cutting edge.

Another aspect of the present disclosure provides a display panel comprising a disclosed array substrate.

Another aspect of the present disclosure provides a display apparatus comprising a disclosed display panel.

Another aspect of the present disclosure provides an encapsulation method for the disclosed display panel, comprising dividing the encapsulation region of the array substrate into the first region adjacent to the display region of the array substrate and the second region far away from the display region, forming the metal layer in the second region, forming the frit solution layer in both the first region and the second region, aligning and bonding the array substrate with an encapsulation cover, and cutting the bonded array substrate and encapsulation cover along a cutting edge configured in the first region to form the display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, features, and functions of the present disclosure more comprehensible, the present disclosure will be described with reference to the accompanying drawings and embodiments. However, the exemplary embodiments are presented for illustrative purposes and should not be construed as limitations. On the contrary, the disclosed embodiments are provided so that the present disclosure will be described thoroughly and completely, and will fully convey the concepts and the inventive thinking of the exemplary embodiments to those skilled in the art. The same reference labels and numerals in the drawings denote the same or similar structures, and a repetitive description thereof will be omitted. The expressions and the directions of the present disclosure are described with reference to the accompanying drawings. However, changes may be made if necessary, and all the changes are within the scope of the present disclosure. The drawings are only used for illustrating the relative position relationship, and certain structures may be shown in a disproportional scale for the purpose of comprehension. The dimensions in the drawings do not represent the actual proportional relationship.

The thickness and shape of each component in the drawings do not reflect the actual scale of the array substrate, and are merely for illustrative purposes and are not intended to limit the scope of the present disclosure.

Figure 1:
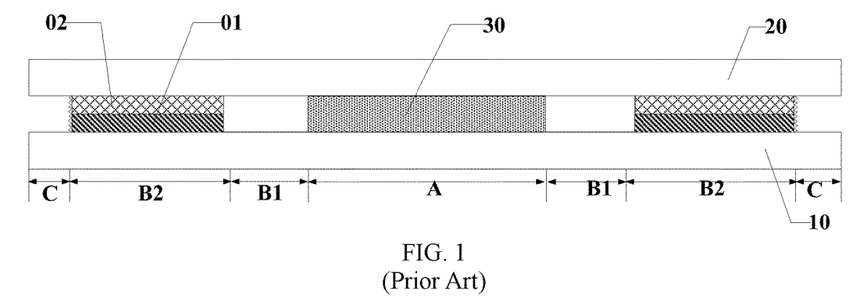
FIG. 1 illustrates a cross-sectional view of an existing display panel.

FIG. 1 illustrates a cross-sectional view of an existing display panel. The display panel includes an array substrate. The array substrate includes a display region A and a bezel region surrounding the display region A. The bezel region includes a wiring region B1 surrounding the display region A and an encapsulation region B2 surrounding the wiring region B1. The display region A includes a display unit 30. The frit solution encapsulation process for the existing display panel includes the following steps.

First, a metal layer (e.g., frit metal layer) 01 is formed in the encapsulation region B2 of the array substrate. Then, a frit solution layer 02 is formed on the metal layer 01 through a dispensing or printing process. Through a laser beam melting process, the array substrate formed with the metal layer 01 and the frit solution layer 02 is aligned and bonded with an encapsulation cover/cover lens 20. Finally, the edges of the array substrate 01 bonded with the encapsulation cover 20 are cut to form a display panel.

In the existing display panel, the frit solution layer 02 in the encapsulation region A is formed through a silk-screen printing process. To ensure that the frit solution layer 02 spreads smoothly, maintains straight lines at the edges, and has a uniform surface, the silk-screen must include at least 4 to 6 mesh grid openings or holes. When a line width in the encapsulation region B2 is about 200 μm, only 3.15 mesh grid openings actually fit into the line, which may be the finest resolution of the silk-screen printing process. In practical application scenarios, after the silk-screen printing, the frit solution layer 02 may expand outward. Thus, in the existing display panel, the width of the frit solution layer 02 needs to be at least 300 μm, which negatively affects the design of the narrow bezel of the display panel.

In the existing display panel, when the metal layer 01 and the frit solution layer 02 are formed in the encapsulation region B2, the edges are often not sufficiently flat. When the edges of the display panel are cut directly in the encapsulation region B2, the cutting result is often undesirable. In the existing display panel, a cutting region C of at least 150 μm is often reserved in the peripheral of the encapsulation region B2. Currently, the frit solution layer 02 is often about 325 μm wide, which further widens the bezel of the display panel. Thus, it is difficult to design a substantially narrow bezel in the existing display panel, and the display performance is affected.

Figure 2:
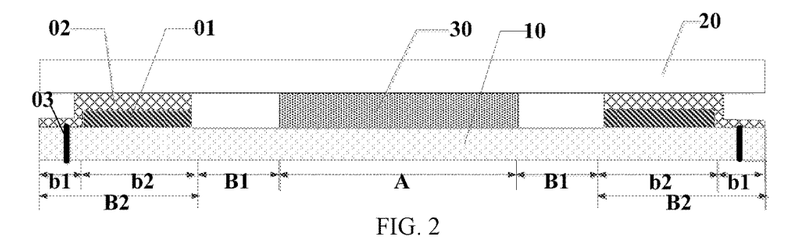
FIG. 2 illustrates a cross-sectional view of an exemplary array substrate according to the disclosed embodiments.
Figure 3:
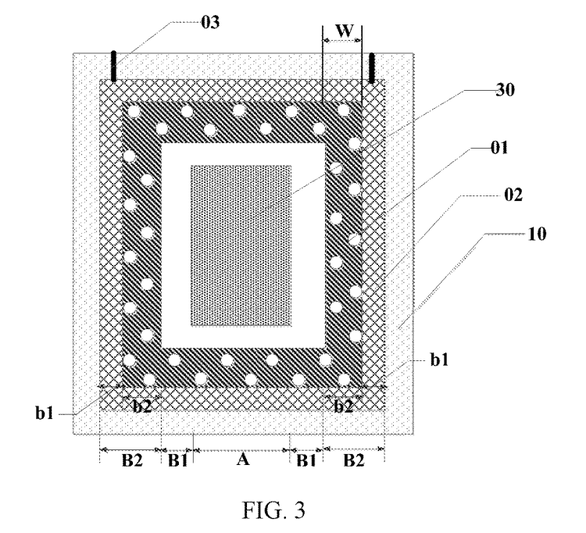
FIG. 3 illustrates a top view of an exemplary array substrate in FIG. 2.

FIG. 2 illustrates a cross-sectional view of an exemplary array substrate according to the disclosed embodiments. FIG. 3 illustrates a top view of an exemplary array substrate in FIG. 2.

As shown in FIG. 2 and FIG. 3, the array substrate may include a display region A, a wiring region B1 surrounding the display region A, and an encapsulation region B2 surrounding the wiring region B1. The display region A may include a display unit 30. The encapsulation region B2 may include a first region b1 and a second region b2. The first region b1 may be far away from the display region A, and the second region b2 may be close to the display region A. The encapsulation region B2 may include a metal layer 01 configured only in the second region b2 and a frit solution layer 02 configured in both the first region b1 and the second region b2. The encapsulation region B2 may further include a cutting edge 03 disposed in the first region b1. After the array substrate that is aligned and bonded with/attached to an encapsulation cover 20, a cutting may be performed at the cutting edge 03.

In the disclosed embodiments, the array substrate may include an encapsulation region and a display region. The encapsulation region may be divided into a first region and a second region. The first region may be far away from the display region. The second region may be close to the display region. The encapsulation region may include a metal layer configured in the second region and a frit solution layer configured in both the first region and the second region. The encapsulation region may further include a cutting edge disposed in the first region. After the array substrate that is aligned and bonded with/attached to an encapsulation cover 20, a cutting may be performed at the cutting edge 03.

In the disclosed embodiments, the encapsulation region in the existing array substrate may be divided into the first region and the second region. The cutting edge may be disposed in the first region. Because the first region has only the frit solution layer and does not have the metal layer, when the cutting is performed along the cutting edge in the first region of the array substrate which has been aligned and bonded with the encapsulation cover, defective cutting may be unlikely to occur. Further, performing the cutting along the cutting edge in the first region of the array substrate which has been aligned and bonded with the encapsulation cover may be equivalent to cutting off a portion of the encapsulation region in the existing array substrate. As a comparison, in the existing array substrate, to prevent the defective cuttings, an area with a certain width may have to be reserved at the encapsulation region, and the cutting is performed at the reserved area. Thus, the disclosed array substrate may facilitate a substantially narrow bezel design and improve the display performance.

In the disclosed array substrate, the display unit may be a plasma display unit, a field emission display unit, a light-emitting diode (LED) display unit, an organic light-emitting diode (OLED) display unit, a liquid crystal display unit, a quantum dots (QDs) display unit, an electrophoretic display unit, etc. Further, the display unit may include any appropriate type of display units capable of display images and/or videos.

In one embodiment, when the display unit is an LCD unit, the formed display panel is an LCD display panel, and the encapsulation cover may be a color film substrate. The LCD unit may include a liquid crystal molecule layer. In another embodiment, when the display unit is an OLED display unit, the formed display panel is an OLED display panel, and the encapsulation cover may be a glass cover. The OLED display unit may include a cathode, an anode configured facing toward the cathode, and a light-emitting structure disposed between the cathode and the anode.

In the disclosed array substrate, the cutting edge may be shown as the black line denoted by the reference line 03 in FIG. 2 and FIG. 3. The cutting edge may also refer to an actual cutting edge of the array substrate.

To achieve a substantially narrow bezel design in the disclosed array substrate, in one embodiment, as shown in FIG. 2, a distance from the cutting edge 03 to a border line between the second region b2 and the first region b1 may be shorter than one half of the width of the first region b1. Provided that the encapsulation of array substrate and the encapsulation cover 20 is not affected, when the cutting edge 03 is configured closer to the second region b2, the width of the remained first region b1 (i.e., the width of the non-cutting-off region in the first region b1) may be narrower after the cutting is performed on the array substrate which has been aligned bonded with the encapsulation cover 20. That is, the sum of the width of the remained first region b1 and the width of the second region b2 may become narrower, thereby further facilitating the narrow bezel design and improving the display performance.

In practical applications, the distance from the cutting edge 03 to the border line between the second region b2 and the first region b1 may be determined according to various application scenarios. In one embodiment, the distance from the cutting edge 03 to the border line between the second region b2 and the first region b1 may be approximately between 10 μm and 50 μm. Thus, the sum of the width of the remained first region b1 and the width of the second region b2 may be substantially small, and a substantially narrow bezel design may be achieved.

In one embodiment, the frit solution layer 02 in the first region b1 and the frit solution layer 02 in the second region b2 may be formed as an integrated structure, and the frit solution layer 02 in the second region b2 may cover the metal layer 01. Thus, the frit solution layer 02 in the first region b1 and the frit solution layer 02 in the second region b2 may be formed through a single graphical patterning process. Thus, the fabrication process may be simplified, the production cost may be reduced, and the production yield may be increased.

In practical applications, the width of the first region b1 may be determined according to various application scenarios. When the width of the first region b1 is substantially wide, the width of the second region b2 may be substantially narrow, and a substantially large portion of the first region b1 may be removed by cutting and, thus, the encapsulation quality may be degraded. To ensure the encapsulation quality, in one embodiment, as shown in FIG. 2, the width of the first region b1 may be configured to be smaller than the width of the second region b2.

In addition, because the cutting is performed in the first region b1, provided that the encapsulation quality is not degraded, for the convenience of the cutting, the number of mesh grid openings, the diameter of the mesh grid openings, and the thickness of the mesh of the stencil used in the silk-screen printing process of forming the frit solution layer 02 in the first region b1 may be smaller than the number of mesh grid openings, the diameter of the mesh grid openings, and the thickness of the mesh of the stencil used in the silk-screen printing process of forming the frit solution layer 02 in the second region b2, respectively. Thus, more ink may be dispensed in the second region b2 than in the first region b1, through which the thickness of the frit solution layer 02 in the first region b1 may be controlled to be smaller than the thickness of the frit solution layer 02 in the second region b2. Accordingly, the cutting in the first region b1 may be facilitated, and a certain amount of the frit solution may be saved when forming the frit solution layer 02 in the first region b1.

In one embodiment, to ensure the encapsulation quality, the width of the first region b1 may be configured to be approximately between 20 μm and 50 μm, and the width of the second region b2 may be configured to be approximately between 100 μm and 250 μm.

In practical applications, the thickness of the frit solution layer 02 in the first region b1 and the thickness of the frit solution layer 02 in the second region b2 may be determined according to various application scenarios.

In one embodiment for the convenience of the cutting, the thickness of the frit solution layer 02 in the first region b1 may be configured to be approximately between 1 μm and 5 μm, and the thickness of the frit solution layer 02 in the second region b2 may be configured to be approximately between 5 μm and 10 μm, which is intended to be illustrative and is not limited by the present disclosure.

In the disclosed array substrate, to better melt the frit solution, the width of the metal layer 01 may be configured to be greater than the width of the frit solution layer 02. In practical applications, the width of the metal layer 01 and the width of the frit solution layer 02 may be determined according to various application scenarios. In one embodiment, as shown in FIG. 3, the width W of the metal layer 01 may be configured to be approximately between 100 μm and 400 μm.

Figure 4:
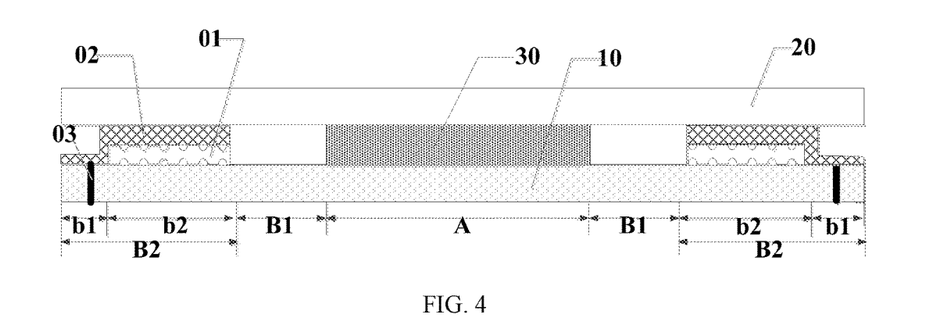
FIG. 4 illustrates a cross-sectional view of another exemplary array substrate according to the disclosed embodiments.
Figure 5:
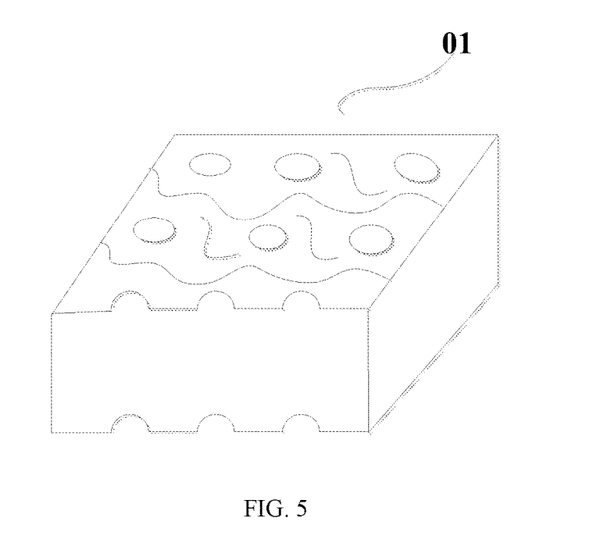
FIG. 5 illustrates a schematic view of an exemplary metal layer in an exemplary array substrate according to the disclosed embodiments.

To increase the bonding strength of the frit solution, in one embodiment, as shown in FIG. 3, FIG. 4, and FIG. 5, the metal layer 01 may include a plurality of holes. A ratio of the summation of the area sizes of the plurality of the holes over the area size of the metal layer 01 may be configured to be approximately between 15% and 30%, and a diameter of the hole may be configured to be approximately between 40 μm and 45 μm. When the metal layer 01 which includes the plurality of holes is coated by the frit solution layer 02, the frit solution may fill the holes. That is, the frit solution may cover the surface of the metal layer 01 and penetrate into the metal layer 01 through the holes in the metal layer 01. Thus, when the metal layer 01 is melted by laser beam, the bonding strength of the frit solution may be increased, the bonding between the array substrate and the encapsulation cover 20 may be enhanced, and the production yield may be improved.

In another embodiment, as shown in FIG. 5, the metal layer 01 may include a rough surface in addition to the plurality of the holes. When the laser beam irradiates on the metal layer 01, the laser beam may be more likely to be reflected back and forth multiple times by the rough surface, thereby increasing the utilization rate of the laser beam. Accordingly, the melting of the frit solution may be facilitated, and the bonding strength of the frit solution may be further improved.

In one embodiment, in the disclosed array substrate, a bezel width after the cutting may be approximately between 0.55 mm and 0.8 mm. Compared to the bezel width of the existing display panel, the bezel width of the disclosed display panel may be reduced by approximately between 0.2 mm and 0.35 mm. That is, the disclosed array substrate may be able to realize a substantially narrow bezel.

Figure 6:
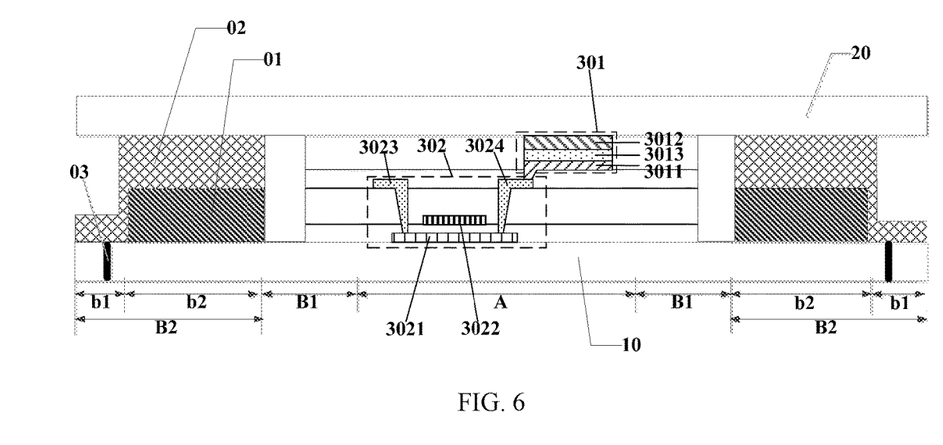
FIG. 6 illustrates a cross-sectional view of another exemplary array substrate according to the disclosed embodiments.

FIG. 6 illustrates a cross-sectional view of another exemplary array substrate according to the disclosed embodiments. As shown in FIG. 6, the display unit 30 of the region A may include at least one thin-film-transistor (TFT) structure 302 and at least one light-emitting structure 301 disposed above the TFT structure 302. The TFT structure 302 may include an active layer 3021 disposed on the substrate 10, a gate electrode layer 3022 disposed on the active layer 3021 and insulated from the active layer 3021, and a source electrode layer 3023 and a drain electrode layer 3024 which may be both electrically connected to the active layer 3021 and insulated from the gate electrode layer 3022. The source electrode layer 3023 and drain electrode layer 3024 together may be called as a source-drain electrode layer.

The light-emitting structure 301 may include an anode 3011, a cathode 3012, and an organic light-emitting layer 3013 disposed between the anode 3011 and the cathode 3012. The anode 3011 may be electrically connected to the drain electrode layer 3024. In one embodiment, the metal layer 01 may be configured coplanar with the gate electrode layer 3022, and in another embodiment, the metal layer 01 may be configured coplanar with the source electrode layer 3023. Thus, through only changing the graphical patterning when forming the gate electrode layer 3022 or the source-drain electrode layer, the metal layer 01 may be formed together with the gate electrode layer 3022 or with the source-drain electrode layer in a one-time graphical patterning process. That is, a separate process step may not have to be introduced to form the metal layer 01. Thus, the fabrication process may be simplified, the production cost may be reduced, and the production yield may be improved.

In one embodiment, the frit solution layer 02 may be made primarily of $Bi_2O_3$, ZnO, $Al_2O_3$, and $MnO_2$, which are for illustrative purposes and are not intended to limit the scope of the present disclosure.

Figure 7:
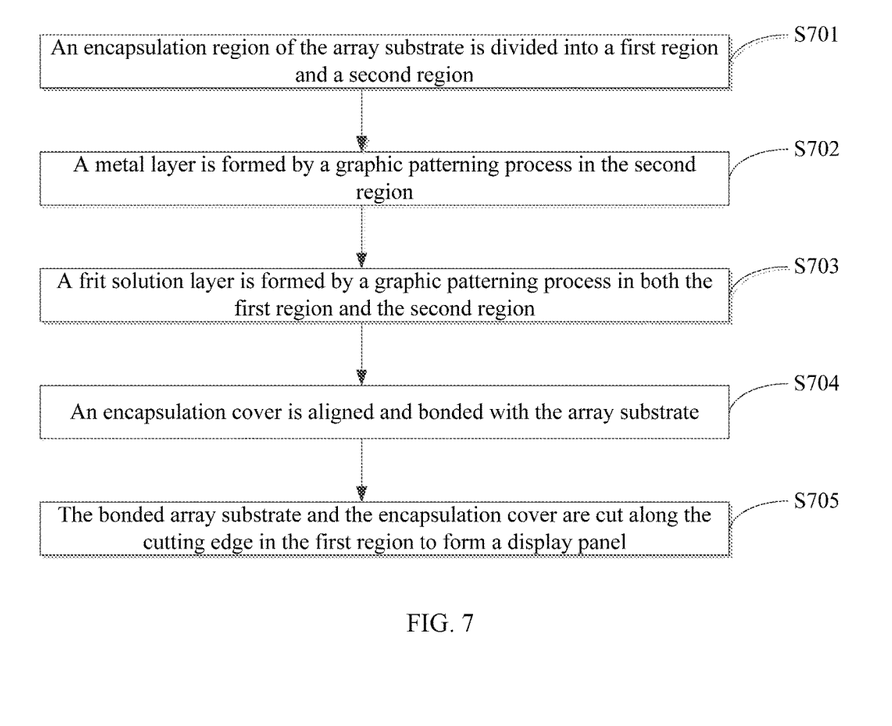
FIG. 7 illustrates a flow chart of an exemplary display panel encapsulation method according to the disclosed embodiments.

The present disclosure also provides an encapsulation method for an array substrate. FIG. 7 illustrates a flow chart of an exemplary encapsulation method for an exemplary display panel according to the disclosed embodiments. The encapsulation method may include the following steps.

As shown in FIG. 7, at the beginning, an encapsulation region of the array substrate is divided into a first region and a second region (S701). The corresponding structure is shown in FIG. 9A.

Figure 9A:
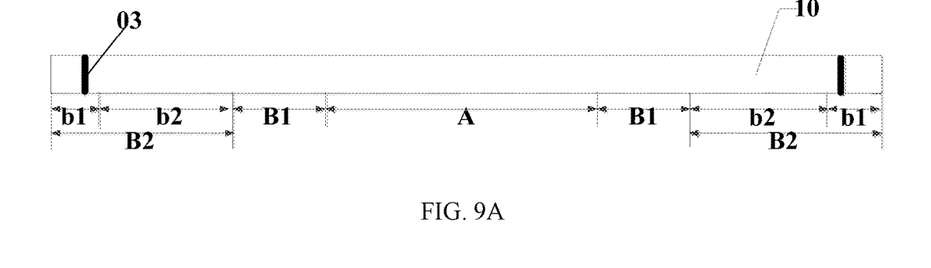
FIGS. 9A-9F illustrate various cross-sectional views of an exemplary display panel at different stages of the encapsulation process according to the disclosed embodiments.

In particular, referring to FIG. 9A, the encapsulation region B2 of the array substrate may be divided into a first region b1 and a second region b2. A cutting edge 03 may be disposed in the first region b1.

Returning to FIG. 7, after the encapsulation region of the array substrate is divided into a first region and a second region, a metal layer is formed by a graphic patterning process in the second region (S702). The corresponding structure is shown in FIG. 9B.

Figure 9B:
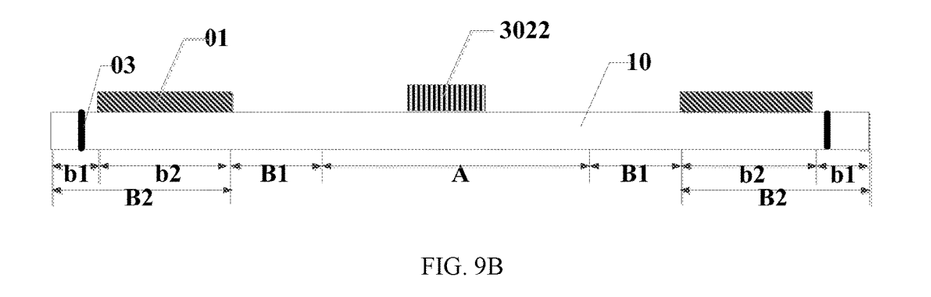

In particular, referring to FIG. 9B, a metal layer 01 may be formed on the substrate 10 in the second region b2 by a same process as forming a gate electrode layer (the gate electrode layer 3022 shown in FIG. 9B as an example), or a source-drain electrode layer. After the metal layer 01 is deposited on the substrate 10, a photolithography process may be used to form a plurality of holes in the metal layer 01 and a rough surface of the metal layer 01.

Returning to FIG. 7, after a metal layer is formed by a graphic patterning process in the second region, a frit solution layer is formed by a graphic patterning process in both the first region and the second region (S703). The corresponding structure is shown in FIG. 9C.

Figure 9C:
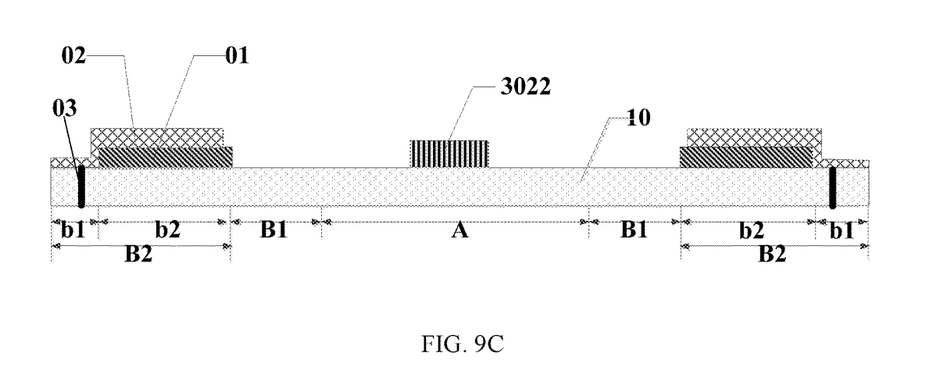

In particular, referring to FIG. 9C, a frit solution layer 02 may be formed in both the first region b1 and the second region b2 by a graphic patterning process, which may be a silk-screen printing process. The number of mesh grid openings, the diameter of the mesh grid openings, and the thickness of the mesh of the stencil used in the silk-screen printing process of forming the frit solution layer 02 in the first region b1 may be smaller than the number of mesh grid openings, the diameter of the mesh grid openings, and the thickness of the mesh of the stencil used in the silk-screen printing process of forming the frit solution layer 02 in the second region b2, respectively. As such, more ink may be dispensed in the second region b2 than in the first region b1, such that the thickness of the frit solution layer 02 in the first region b1 may be controlled to be smaller than the thickness of the frit solution layer 02 in the second region b2.

Figure 8:
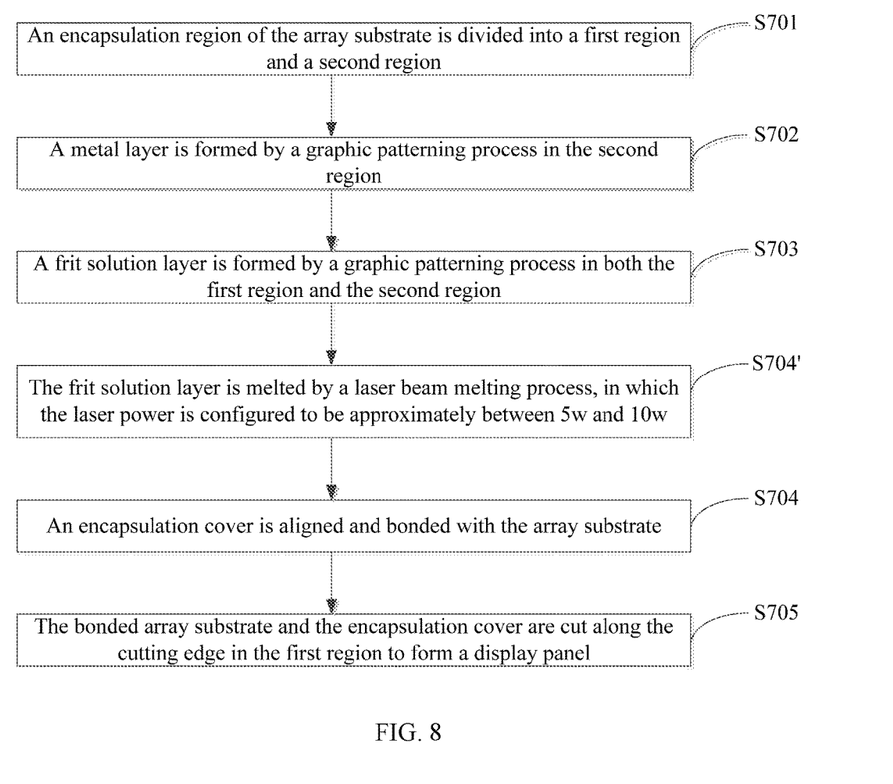
FIG. 8 illustrates a flow chart of another exemplary display panel encapsulation method according to the disclosed embodiments.

FIG. 8 illustrates a flow chart of another exemplary display panel encapsulation method according to the disclosed embodiments. In one embodiment, as shown in FIG. 8, after the frit solution layer 02 is formed by a graphic patterning process in both the first region b1 and the second region b2 and before an encapsulation cover 20 is aligned and bonded to the array substrate, the frit solution layer is melted by a laser beam melting process, in which the laser power is configured to be approximately between 5 w and 10 w (S704'). The corresponding structure is shown in FIG. 9D.

Figure 9D:
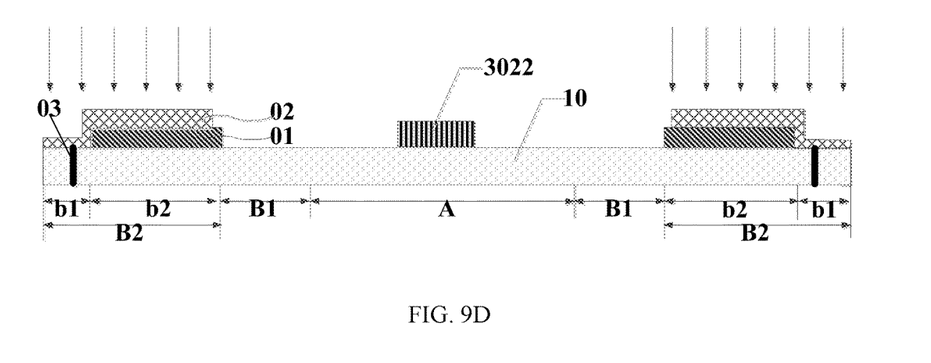

In particular, referring to FIG. 9D, the frit solution layer 02 may be melted by a laser beam melting process, in which the laser power may be configured to be approximately between 5 w and 10 w.

Returning to FIG. 7, after a frit solution layer is formed by a graphic patterning process in both the first region and the second region, an encapsulation cover is aligned and bonded with the array substrate (S704). The corresponding structure is shown in FIG. 9E.

Figure 9E:
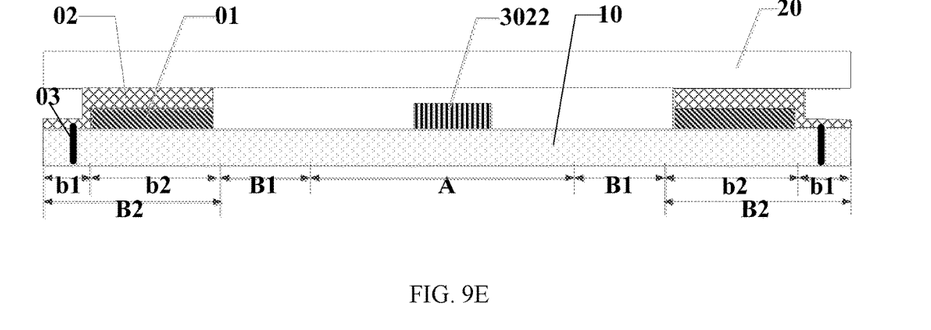

In particular, referring to FIG. 9E, an encapsulation cover 20 may be aligned and bonded with the array substrate.

Returning to FIG. 7, after an encapsulation cover is aligned and bonded with the array substrate, the bonded array substrate and the encapsulation cover are cut along the cutting edge in the first region to form a display panel (S705). The corresponding structure is shown in FIG. 9F.

Figure 9F:
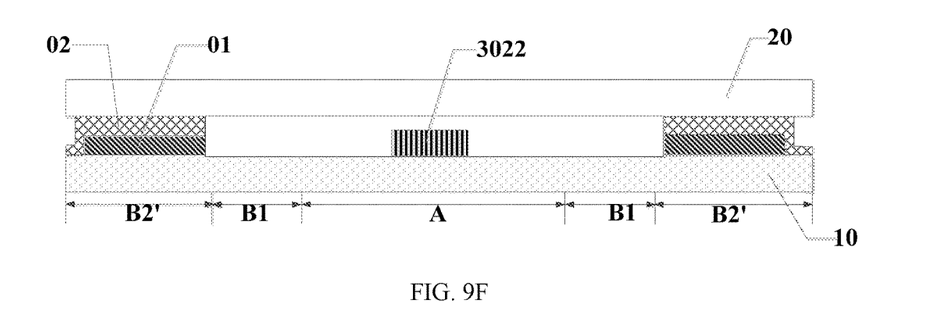

In particular, referring to FIG. 9F, the bonded array substrate and the encapsulation cover 20 may be cut along the cutting edge 03 in the first region b1. After the cutting, the display panel may be formed.

In the disclosed embodiments, the array substrate may include an encapsulation region and a display region. The encapsulation region may be divided into a first region and a second region. After the array substrate which has aligned and bonded with an encapsulation cover, a cutting may be performed at a cutting edge configured in the first region. Because the first region has only the frit solution layer and does not have the metal layer, after the array substrate has been aligned and bonded with an encapsulation cover, the cutting is performed in the first region, and defective cuttings may be suppressed. As a comparison, in the existing array substrate, to prevent defective cuttings, an area with a certain width may not have to be reserved at the border of the encapsulation region in the display panel. Thus, the disclosed array substrate may facilitate the narrow bezel design of the display panel, and improve the display performance.

In one embodiment, a distance from the cutting edge to a border line between the second region and the first region may be shorter than one half of the width of the first region. Provided that the encapsulation of the array substrate and the encapsulation cover is not affected, when the cutting edge is configured to be closer to the second region, the width of the remained first region may be narrower after the cutting is performed on the array substrate which has been aligned and bonded with the encapsulation cover. That is, the sum of the width of the remained first region and the width of the second region may become narrower, thereby facilitating the narrow bezel design and improving the display performance.

In practical applications, the width of the first region may be determined according to various application scenarios. To ensure the encapsulation quality, in one embodiment, the width of the first region may be configured to be smaller than the width of the second region. In practical applications, the thickness of the frit solution layer in the first region and the thickness of the frit solution layer in the second region may be determined according to various application scenarios. To improve the encapsulation quality, the thickness of the frit solution layer in the first region may be configured to be smaller than the thickness of the frit solution layer in the second region. Accordingly, the cutting in the first region may be facilitated, a certain amount of the frit solution may be saved when forming the frit solution layer in the first region, and the production cost may be reduced.

In one embodiment, the frit solution layer in both the first region and the second region may be formed by a single graphic patterning process, and the frit solution layer in the second region may cover the metal layer, such that the fabrication process may be simplified, the production cost may reduced, and the production yield may be increased.

In one embodiment, the frit solution layer in both the first region and the second region may be formed by a silk-screen printing process. The silk-screen printing process is an existing process and will not be described herein.

In one embodiment, the frit solution layer in the first region and the frit solution layer in the second region may be formed as an integrated structure. The number of mesh grid openings of the stencil used in the silk-screen printing process to form the frit solution layer may be guaranteed to be sufficient to ensure that the frit solution layer spreads smoothly, maintains straight lines at the edges, and has a uniform surface. Compared to the existing array substrate, the width of the metal layer in the disclosed array substrate may be narrower, thereby facilitating a substantially narrower bezel design of the display panel.

In one embodiment, the number of mesh grid openings, the diameter of the mesh grid openings, and the thickness of the mesh of the stencil used in the silk-screen printing process of forming the frit solution layer in the first region may be smaller than the number of mesh grid openings, the diameter of the mesh grid openings, and the thickness of the mesh of the stencil used in the silk-screen printing process of forming the frit solution layer in the second region, respectively. Thus, more ink may be dispensed in the second region than in the first region, through which the thickness of the frit solution layer in the first region may be controlled to be smaller than the thickness of the frit solution layer in the second region. Accordingly, the cutting in the first region may be facilitated, and a certain amount of the frit solution may be saved when forming the frit solution layer in the first region.

Figure 10:
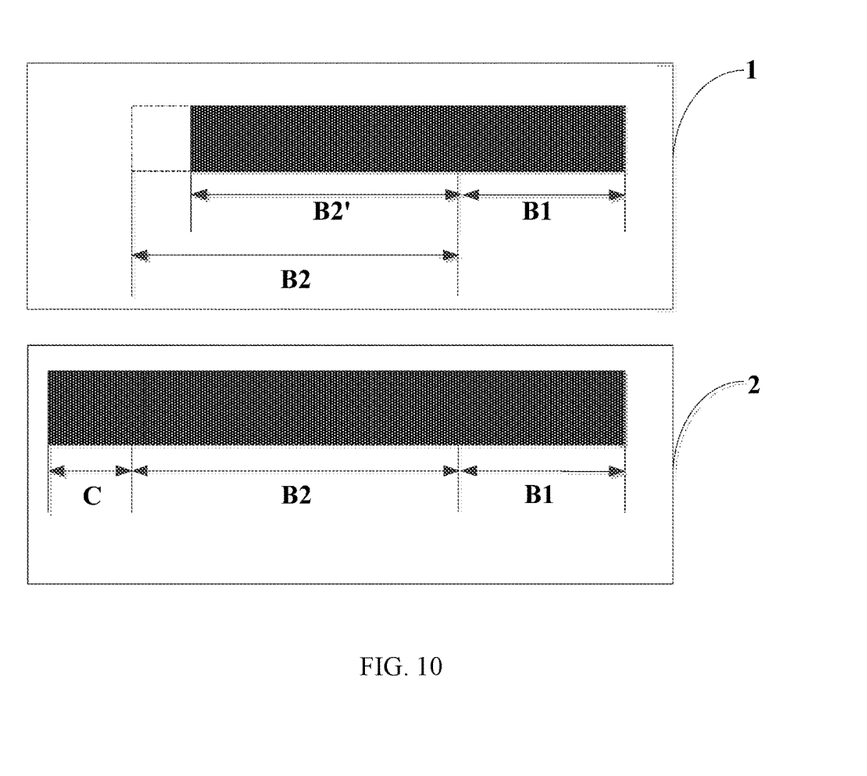
FIG. 10 compares bezel widths between an existing display panel and an exemplary display panel encapsulated by an exemplary encapsulation method according to the disclosed embodiments.

FIG. 10 compares bezel widths between an existing display panel and an exemplary display panel encapsulated by an exemplary encapsulation method according to the disclosed embodiments. As shown in FIG. 10, in the existing display panel 2, the width of the encapsulation region may be B2+C. In the display panel 1 encapsulated by an exemplary encapsulation method according to the disclosed embodiments, the width of the encapsulation region may be B2'. Obviously, B2' is smaller than B2. Thus, the disclosed encapsulation method may facilitate a substantially narrow bezel design of the display panel.

Figure 11:
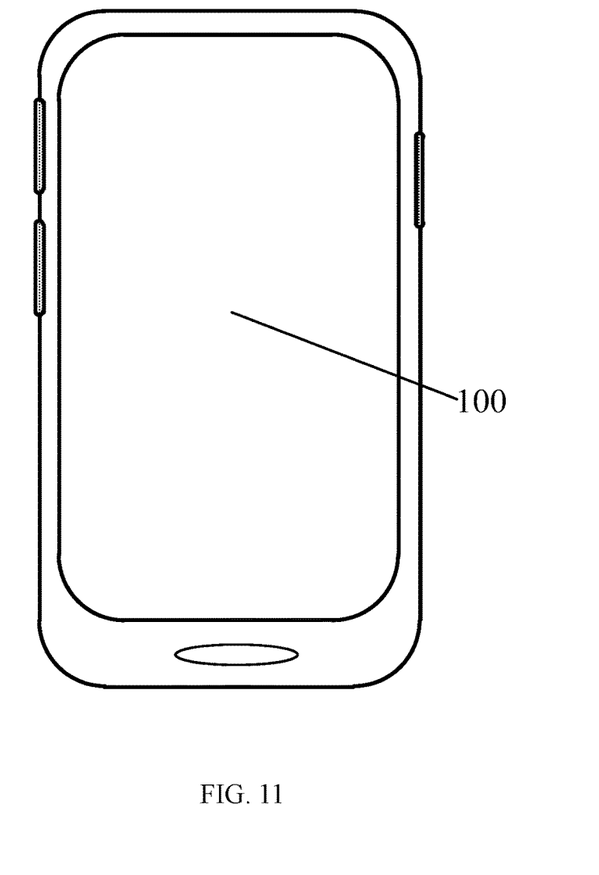
FIG. 11 illustrates a schematic view of an exemplary display apparatus according to the disclosed embodiments.

FIG. 11 illustrates a schematic view of an exemplary display apparatus according to the disclosed embodiments. As shown in FIG. 11, the display apparatus may include a display panel 100. The display panel may be any one of the disclosed display panels. The smart phone in FIG. 11 is intended for illustrative purposes, and is not intended to limit the scope of the present disclosure. Because the display apparatus includes the disclosed display panel, the display apparatus may have the same features and functions of the disclosed display panel. The description of the display apparatus may refer to the disclosed array substrate, and will not be repeated herein.

The present disclosure provides an array substrate, a display panel, an encapsulation method for the display panel, and a display apparatus. The array substrate may include the encapsulation region and the display region. The encapsulation region may include a first region away from the display region and a second region adjacent to the display region. The encapsulation region may include a metal layer configured only in the second region, and a frit solution layer configured in both the first region and the second region. A cutting edge is configured in the first region for cutting the array substrate after the array substrate is aligned and bonded with an encapsulation cover. Through dividing the original encapsulation region into the first region and the second region and configuring the cutting edge in the first region, because the first region only has the frit solution layer and does not have the metal layer, defective cutting may be unlikely to occur when cutting the array substrate, which has been aligned and bonded with the encapsulation cover, along the cutting edge in the first region. Further, to prevent the defective cutting, an area with a certain width may not have to be reserved at the border of the encapsulation region in the display panel. Thus, the disclosed array substrate facilitates a substantially narrow bezel design of the display panel, and improves the display performance.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. An array substrate, comprising:
a display region; and
an encapsulation region divided into a first region away from the display region and a second region adjacent to the display region,
wherein:
the encapsulation region includes a metal layer configured only in the second region, a frit solution layer configured in both the first region and the second region, and a cutting edge configured in the first region, the cutting edge disposed along a part of the frit solution layer in the first region and having a distance from a border line of the first region away from the second region; and
the array substrate is cut along the cutting edge.

2. The array substrate according to claim 1, wherein:
a distance from the cutting edge to a border line between the second region and the first region is shorter than one half of a width of the first region.

3. The array substrate according to claim 1, wherein:
the frit solution layer in the first region and the frit solution layer in the second region have an integrated structure; and
the frit solution layer in the second region covers the metal layer.

4. The array substrate according to claim 3, wherein:
a width of the first region is smaller than a width of the second region; and
a thickness of the frit solution layer in the first region is smaller than a thickness of the frit solution layer in the second region.

5. The array substrate according to claim 4, wherein:
the width of the first region is approximately between 20 μm and 50 μm; and
the width of the second region is approximately between 100 μm and 250 μm.

6. The array substrate according to claim 5, wherein:
the thickness of the frit solution layer in the first region is approximately between 1 μm and 5 μm; and
the thickness of the frit solution layer in the second region is approximately between 5 μm and 10 μm.

7. The array substrate according to claim 6, wherein:
a width of the metal layer is approximately between 100 μm and 400 μm.

8. The array substrate according to claim 7, wherein:
the metal layer is formed with a plurality of holes;
a ratio of a sum of areas of the plurality of the holes over an area of the metal layer is configured to be approximately between 15% and 30%; and
a diameter of a hole is configured to be approximately between 40 μm and 45 μm.

9. The array substrate according to claim 8, wherein:
the metal layer is configured with a rough surface in an area excluding the plurality of holes.

10. The array substrate according to claim 1, further including:
a gate electrode layer; and
a source-drain electrode layer, wherein the metal layer is formed coplanar with either the gate electrode layer or the source-drain electrode layer.

11. The array substrate according to claim 1, wherein:
a material of the frit solution layer includes at least one of $Bi_2O_3$, $ZnO$, $Al_2O_3$, and $MnO_2$.

12. A display panel, comprising an array substrate including:
a display region; and
an encapsulation region divided into a first region away from the display region and a second region adjacent to the display region,
wherein:
the encapsulation region includes a metal layer configured only in the second region, a frit solution layer configured in both the first region and the second region, and a cutting edge configured in the first region, the cutting edge disposed along a part of the frit solution layer in the first region and having a distance from a border line of the first region away from the second region; and
the array substrate is cut along the cutting edge.

13. A display apparatus, comprising the display panel according to claim 12.

* * * * *